United States Patent
Kim et al.

(10) Patent No.: US 9,454,624 B2
(45) Date of Patent: Sep. 27, 2016

(54) SYSTEM AND METHOD FOR TIME-BASED GRAPHICAL SIMULATION OF A NATURAL EFFECT

(71) Applicant: Adobe Systems Incorporated, San Jose, CA (US)

(72) Inventors: Byungmoon Kim, Sunnyvale, CA (US); Gregg D. Wilensky, Pacific Palisades, CA (US); Min Jung Son, Pohang (KR)

(73) Assignee: ADOBE SYSTEMS INCORPORATED, San Jose, CA (US)

( * ) Notice: Subject to any disclaimer, the term of this patent is extended or adjusted under 35 U.S.C. 154(b) by 511 days.

(21) Appl. No.: 13/938,414

(22) Filed: Jul. 10, 2013

(65) Prior Publication Data

US 2015/0019184 A1    Jan. 15, 2015

(51) Int. Cl.
| | |
|---|---|
| *G06T 13/20* | (2011.01) |
| *G06F 17/50* | (2006.01) |
| *G06T 13/60* | (2011.01) |
| *F21S 10/04* | (2006.01) |

(52) U.S. Cl.
CPC ........... *G06F 17/5009* (2013.01); *G06T 13/20* (2013.01); *G06T 13/60* (2013.01); *A63F 2300/66* (2013.01); *F21S 10/046* (2013.01)

(58) Field of Classification Search
None
See application file for complete search history.

(56) References Cited

U.S. PATENT DOCUMENTS

| | | | | |
|---|---|---|---|---|
| 5,442,733 A * | 8/1995 | Kaufman | ................ | G06T 15/50 345/419 |
| 7,133,052 B1 * | 11/2006 | Silva | .................... | G06T 3/0093 345/646 |
| 7,724,258 B2 * | 5/2010 | Ebert | ...................... | G06T 13/60 345/419 |
| 8,768,786 B2 * | 7/2014 | Paolini | ............... | G06Q 10/0637 705/14.49 |
| 9,138,649 B2 * | 9/2015 | Matsushita | ............. | A63F 13/10 |
| 2006/0098428 A1 * | 5/2006 | Rosserot | ................. | F24C 7/004 362/227 |
| 2008/0037254 A1 * | 2/2008 | O'Neill | .................... | F21S 10/04 362/293 |
| 2009/0313866 A1 * | 12/2009 | Wang | ..................... | F24C 7/004 40/428 |
| 2010/0265258 A1 * | 10/2010 | Stonier | ................... | F24C 7/004 345/473 |
| 2011/0062250 A1 * | 3/2011 | Betz | ........................ | F24C 7/004 239/102.1 |
| 2011/0128732 A1 * | 6/2011 | Mantooth | ............... | F21S 10/04 362/235 |
| 2011/0148882 A1 * | 6/2011 | Roh | ....................... | G09B 23/12 345/440 |
| 2012/0219933 A1 * | 8/2012 | Chen | ...................... | G09B 19/24 434/219 |
| 2014/0081612 A1 * | 3/2014 | Ignatoff | ................. | G01N 11/00 703/9 |
| 2014/0250747 A1 * | 9/2014 | Pan | ......................... | F21S 10/04 40/428 |
| 2014/0305013 A1 * | 10/2014 | Peterson | ................. | F24C 7/004 40/428 |

* cited by examiner

*Primary Examiner* — Kibrom K Gebresilassie
(74) *Attorney, Agent, or Firm* — Shook Hardy & Bacon L.L.P.

(57) ABSTRACT

A system and method are disclosed for simulating a sequence of discrete natural effects, each natural effect of the sequence being based on an initial natural effect, an immediately preceding natural effect, and a time interval since the immediately preceding natural effect. The initial effect is a two-dimensional simulated natural effect and wherein a last one of the second consecutive simulated natural effect is a three-dimensional simulated natural effect.

16 Claims, 5 Drawing Sheets

SYSTEM AND METHOD FOR TIME-BASED GRAPHICAL SIMULATION OF A NATURAL EFFECT

TECHNICAL FIELD

This disclosure relates generally to the technical fields of software and/or hardware technology and, in one example embodiment, to a system and method to generate a graphic simulation of a natural effect.

BACKGROUND

The approaches described in this section could be pursued, but are not necessarily approaches that have been previously conceived or pursued. Therefore, unless otherwise indicated herein, the approaches described in this section are not prior art to the claims in this application and are not admitted to be prior art by inclusion in this section.

Computer-generated natural effects may provide graphic facsimiles that simulate processes that are governed in reality by physical laws. Such natural effects may include, but not be limited to, the ignition and/or development of a flame from a fuel source; the development of smoke motions; and the development of clouds. Such natural effects may be rendered as graphical frames for use in graphic designs. For instance, a user may desire a graphic rendering of a flame having certain characteristics, including size, color, shaping from wind or air currents, and so forth.

Historically, such renderings have been generated based on manual drawings, such as by manually creating a picture of a desired flame. However, such manual renderings may be time consuming and, for individuals who are not skilled artists, may not appear lifelike. Computer simulations of such natural effects may be utilized by modeling the natural effect from an initial state according to a model of the physical world and incrementally simulating the natural effect until the effect appears in its desired manner. However, such simulations may be resource and time intensive, as rendering, for instance, a flame may involve computing hundreds of simulated frames of the flame in order to reach the desired flame image.

Further, such computer simulations may become exponentially more resource and time intensive if the natural effect is simulated in three dimensions rather than two dimensions. Such three-dimensional simulations may provide a more rich and realistic image of the natural effect than an otherwise similar two-dimensional image, at the expense of each individual image involving many times as much information as a corresponding two-dimensional image.

BRIEF DESCRIPTION OF DRAWINGS

Embodiments are illustrated by way of example and not limitation in the figures of the accompanying drawings, in which like references indicate similar elements and in which.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, methods, apparatuses or systems that would be known by one of ordinary skill have not been described in detail so as not to obscure claimed subject matter.

Some portions of the detailed description which follow are presented in terms of symbolic representations of operations on binary digital signals stored within a memory of a specific apparatus or special purpose computing device or platform. In the context of this particular specification, the term "specific apparatus" or the like includes a general purpose computer once it is programmed to perform particular functions pursuant to instructions from program software. Symbolic representations are examples of methods or techniques used by those of ordinary skill in the signal processing or related arts to convey the substance of their work to others skilled in the art.

Unless specifically stated otherwise, as apparent from the following discussion, it is appreciated that throughout this specification discussions utilizing terms such as "processing," "computing," "calculating," "determining" or the like refer to actions or methods performed by a specific apparatus, such as a special purpose computer or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

In an example embodiment, a natural effect simulator is provided that may simulate a natural effect with fewer resources and in less time than may be utilized using conventional simulation methods. The simulation may incorporate both a physical model, adaptive time scaling, and a noise factor to permit an extended simulated time interval between initial effects of a simulation sequence in comparison with a shorter simulated time interval between later effects of the simulation sequence, allowing the simulation to be conducted while computing fewer total effects in the sequence. The simulator may provide such simulations in two dimensions or three dimensions. A simulation that produces a final image of the sequence in three dimensions may start with an initial image in two dimensions and develop the three-dimensional simulation during the course of simulating the sequence of effects, transitioning from two dimensions to three dimensions during the simulation and saving computational time and resources in relation to simulating in three dimensions during the entire simulation.

Figure 1A:
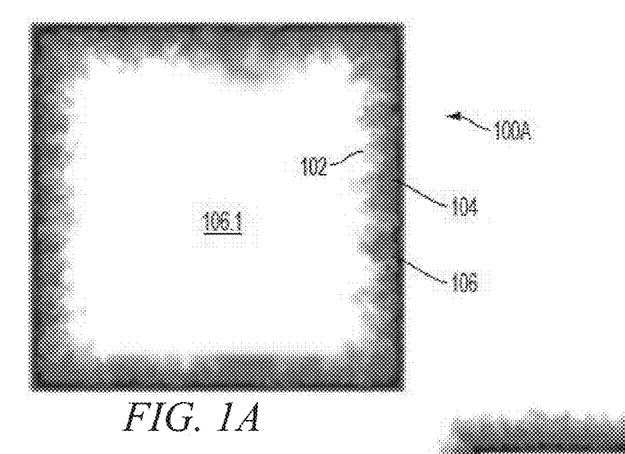
FIGS. 1A-1C are examples of renderings of graphic frames of a natural effect in accordance with an example embodiment.
Figure 1B:
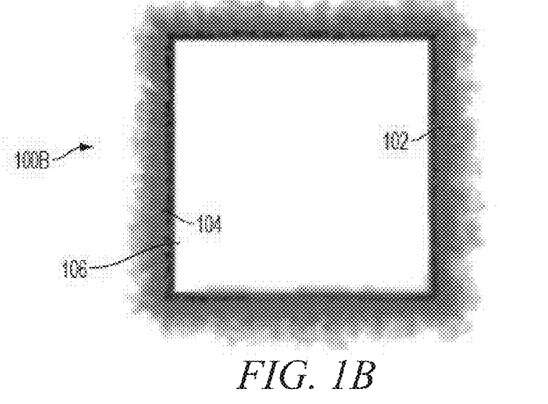
Figure 1C:
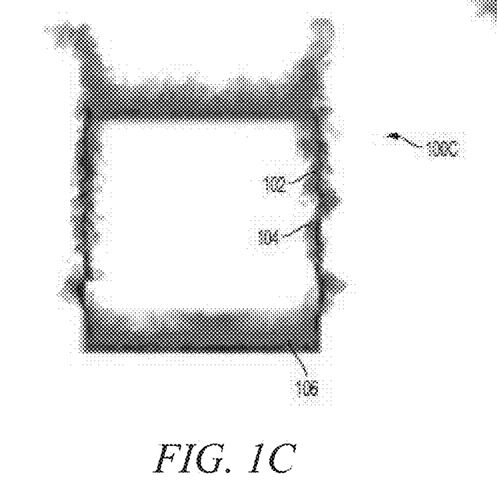

FIGS. 1A-1C are examples of renderings of graphic frames 100A-100C of a natural effect 102, in accordance with an example embodiment. As illustrated, the natural effect 102 is a flame, though it is to be understood that any natural effect or any effect that is governed or capable of being governed by a physical model may be simulated. The natural effect 102 being a flame, a simulated fuel source 104 is created so as to provide an initial basis for simulating the flame as will be disclosed in herein. The fuel source 104 may simulate actual fuel sources, such as burning fluids, wood, and the like at various densities. Alternative natural effects may utilize appropriate initial bases, such as a body of water, smoke density advections, and/or a weather condition, among others.

As illustrated, the example frames 100A-100C provide the natural effect 102 according to a variety of physical models. The various physical models may incorporate various similar or identical properties, such as may govern the generation of the flame itself. However, in the illustrated embodiments, the various frames 100A-100C do optionally incorporate variances in their respective physical models. The frame 100A provides inward buoyancy, generally directing the natural effect 102 toward a middle 106.1 of a box 106 defined by the fuel source 104. The frame 100B provides outward buoyancy, generally directing the natural effect 102 away from the middle 106.1 of the box 106 defined by the fuel source 104. The frame 100C provides upward buoyancy, generally directing the natural effect 102 as if the fuel source 104 existed in the real world with conventional environmental and gravitational conditions.

Figure 2:
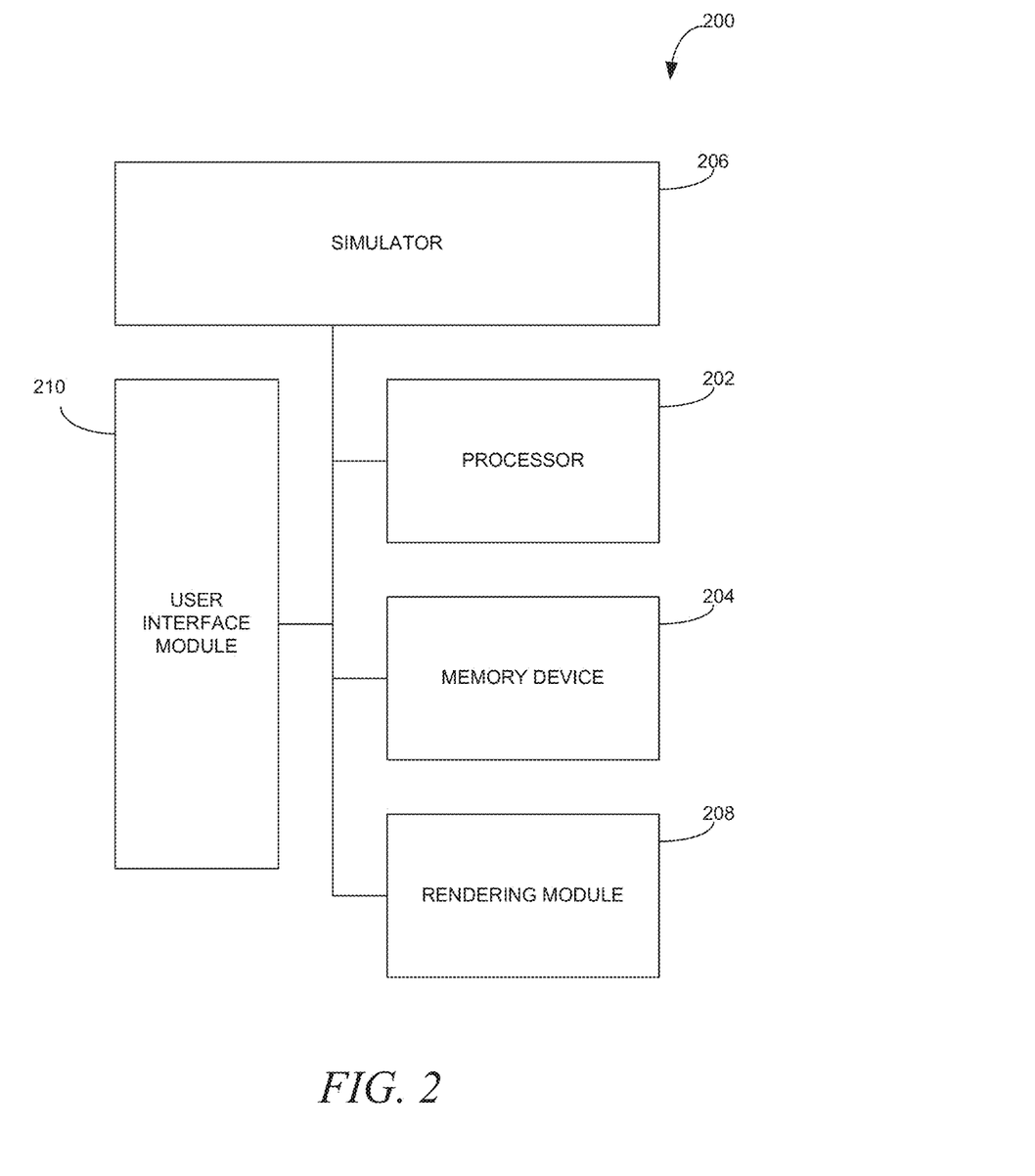
FIG. 2 is a block diagram of a system, in accordance with an example embodiment, configured to simulate and optionally render and display a natural effect.

FIG. 2 is a block diagram of a system 200, in accordance with an example embodiment, configured to simulate and optionally render and display a natural effect. The system 200 may simulate the natural effect 102 and, accordingly, is described by way of example with reference thereto. It should however be noted that the system 200 may also simulate other natural effects.

The system 200 may be implemented according to a variety of configurations. In various examples, the system 200 is included within a single computing device, such as a personal computer, tablet computer, smartphone, and the like. Such single computing devices may incorporate a user interface such as a display screen and an input device for receiving commands, such as a keyboard, mouse, touchscreen, and the like. Alternatively, the system 200 may be included in one or more servers and may be accessed remotely (e.g., in the cloud). For instance, a consumer electronic device such as a tablet computer may access the server over a network to obtain some or all of a simulation, a rendering, and an output configured to be displayed. In various additional embodiments, the system 200 may be located on any other suitable computing system and may be separated between and among a variety of computing systems. For instance, the system 200 may be configured to generate a simulation on a server, transfer the rendering results via a network to a consumer device, and perform rendering and display functions on the consumer device. Additional divisions of system components and responsibilities are also contemplated.

The system 200 includes a processor 202 (or a plurality of processors) that may be located in a single device or platform or may be split between or among multiple devices or platforms. The system 200 further includes memory device 204 that also may be located in a single device or split between or among multiple devices. The memory device 204 may include both electronic memory and long-term data storage.

For producing a natural effect 102, the system 200 optionally includes a simulator 206, a rendering module 208, and a user interface module 210. The simulator 206, rendering module 208, and user interface module 210 may individually utilize or incorporate the processor 202 and memory device 204. Further, it should be noted that in some example embodiments one or more of the modules may be combined into a single module. As with the system 200 generally, the simulator 206, rendering module 208, and user interface module 210 may be individually located in a single device or may be split between or among multiple devices and multiple processors and/or memory devices. Thus, the simulator 206, for instance, may be located in a single device, or the functionality of the simulator 206 may be split between multiple processors and/or multiple devices, such as to perform simulation functions using parallel and/or distributed processing. The rendering module 208 and user interface module 210 may be similarly divided between or among multiple devices and/or processors.

In an example embodiment, the simulator 206 is configured to simulate the natural effect 102 using a method that is implemented mathematically. It is to be understood that the natural effect 102 may be simulated mathematically without being rendered graphically. In the above example, the natural effect shown in frames 100A-100C may be generated by the simulator 206 for subsequent rendering.

The rendering module 208 may be configured to render the natural effect 102 as simulated in a graphical format. In the above example, the frames 100A-100C are rendered by the rendering module 208 based on output from the simulator 206. Upon being rendered by the rendering module 208, the renderings may be formatted for display and/or cause the renderings to be displayed on a user interface by the user interface module 210. In examples in which user interface module 210 is a component of a device that includes a visual display, the user interface module 210 may simply display the rendering on the display. In examples in which the user interface module 210 is located on a server, the user interface module 210 may cause the rendering to be displayed by formatting the rendering for transmittal over a network such that, upon receipt by a remote device, the rendering may be downloaded and displayed conventionally.

In the example of the flame natural effects 102 illustrated in the frames 100A-100C, the simulator 206 is configured to apply a physical model to an initial state to simulate the flame natural effect 102 in sequence over time. While the physical model relating to the flame natural effect 102, it is to be understood that any of a variety of physical models may be applied for various natural effects 102, such as are disclosed herein. Additionally, it is to be understood that the simulator 206 does not necessarily apply a physical model to create a natural effect 102, but rather may utilize any of a variety of relevant processes or models to create a desired effect.

EXAMPLE PHYSICAL MODEL

In an example, the simulator 206 includes and executes the physical model according to method incorporating selectable variables as described in detail herein. In an example, the physical model utilizes a Navier-Stokes and continuity equation solver using operator splitting, semi- Lagrangian advection, implicit viscosity solver, and pressure projection. This solves for the velocity u and pressure P in the Navier-Stokes equation.

$$\frac{\partial u}{\partial t} = -u \cdot \nabla u + v \nabla^2 u + \frac{\nabla P}{\rho} + f \qquad \text{Equation 1}$$

In Equation 1, v is the kinetic viscosity, ρ is density, f is body force, and t is time. The simulator 206 may incorporate temperature T while û may be internal energy. In an example, the changes in û are approximated with a constant heat capacity $c_v$ and heat energy rate by fuel burn rate $\dot{Q}$ as $$\rho \frac{D\check{u}}{Dt} \approx \rho c_v \frac{DT}{Dt} + \dot{Q}$$

energy transport in an infinitesimally small control volume yields the energy equation:

$$\rho \frac{D\hat{u}}{Dt} = \check{k}\nabla^2 T - P\nabla \cdot u + \Phi \approx \rho c_v \frac{DT}{Dt} + \dot{Q} \qquad \text{Equation 2}$$

In Equation 2, D/Dt is the material derivative, P∇·u is the work done by pressure, and Φ is the temperature increase by velocity dissipation. In various examples, the energy released during fuel burn $\dot{Q}$ may be much greater than P∇·u+Φ, in which case P∇·u+Φ may optionally be ignored.

To solve for density ρ, Equations 1 and 2 and continuity equations may be combined with a gas state equation ρ=ρ(P,T), wherein, for an ideal gas, P=ρRT. In various examples, variable density may utilize a compressible flow solver. Alternatively, in various examples, density variation is initially ignored and buoyancy in high temperature gas regions may be added to compensate. In various examples, ignoring density variation and incorporating buoyancy may be less computationally intensive than the compressible flow solver.

In an example, H is a heating value for a fuel, such as an energy released when a unit mass of the fuel is burnt. In an example, for methane, gas, H equals fifty (50) megaJoules per kilogram. In an example, H equals twenty (20) megaJoules per kilogram. In an example, $F_b$ is the rate at which fuel is burnt. In such an example, heat energy is released at the rate Q=H$F_b$.

A radiational cooling rate may be modeled as $C_T T^4$, with $C_T$ being a constant, such as a selectable constant. In various examples, $C_T$ may be selected so that high temperature regions may cool relatively rapidly while cool regions may cool relatively slowly. In an example, $C_T$ is 0.001. In various alternative examples, $C_T$ may be selected to generate any of a variety of desired cooling patterns.

In Equation 2, the cooling of low temperature regions may be based on the temperature diffusion term $\check{k}\nabla^2 T$. In various examples, low temperature cooling is based on exponential decay down to an ambient temperature. Such may be modeled in Equation 2 by replacing the temperature diffusion term $\check{k}\nabla^2 T$ with an exponential decay term $-d_T T$, where $-d_T$ is a selectable decay coefficient. In such an example, heating and cooling may be modeled according to Equation 3:

$$\frac{\partial T}{\partial t} = -u \cdot \nabla T + \frac{H}{\rho c_v} F_b - C_T T^4 - d_T T \qquad \text{Equation 3}$$

In various examples, gas fuels are advanced along the velocity field and are diffused while being burnt at the rate $F_b$. In such an example, fuel behavior may be modeled as Equation 4:

$$\frac{\partial F}{\partial t} = -F_b - u \cdot \nabla F + \mu_F \nabla^2 F \qquad \text{Equation 4}$$

In such an example, $\mu_F$ may be a fuel diffusion coefficient. If T is less than the temperature of ignition, the burn rate $F_b$ may be zero. In various examples, $F_b$ is a function of stochastic air/fuel mixture, oxygen density, and burn rate of the fuel. In various alternative and simplified examples, $F_b$ is a selectable constant.

EXAMPLE TWO-DIMENSIONAL SIMULATION WITH ARTIFICIAL DIVERGENCE

An example two dimensional fire natural effect 102 may be based on Equation 1 solved according to a stable fluids method. Owing to the simulated two-dimensional environment, fluid flow may, in various circumstances, be inefficient or physically impossible to simulate effectively. A divergence factor q may be incorporated into Equation 5:

$$\nabla^2 P = \frac{\rho}{\Delta t}(\nabla \cdot u - q) \qquad \text{Equation 5}$$

The divergence q may be utilized to control a compression/expansion amount and define the compression/expansion based on a buoyancy directional field b. With a constant value b, Equation 6 may be:

$$q = b\nabla \cdot b \qquad \text{Equation 6}$$

In various examples, q may be zero for a region having divergence-free buoyancy directions, positive for regions that are sources for the natural effect 102, and negative for sink regions. The absolute value may be large in a region with rapid changes in a directional field. Compression and/or expansion may be seen from flow out or in along an axis orthogonal to a fuel source. In various examples, buoyancy may be proportional to the difference between velocity u and the buoyancy directional field b.

EXAMPLE SIMULATED TIME VARIANCE WITH ADAPTIVE TIME-STEPPING

Figure 3:
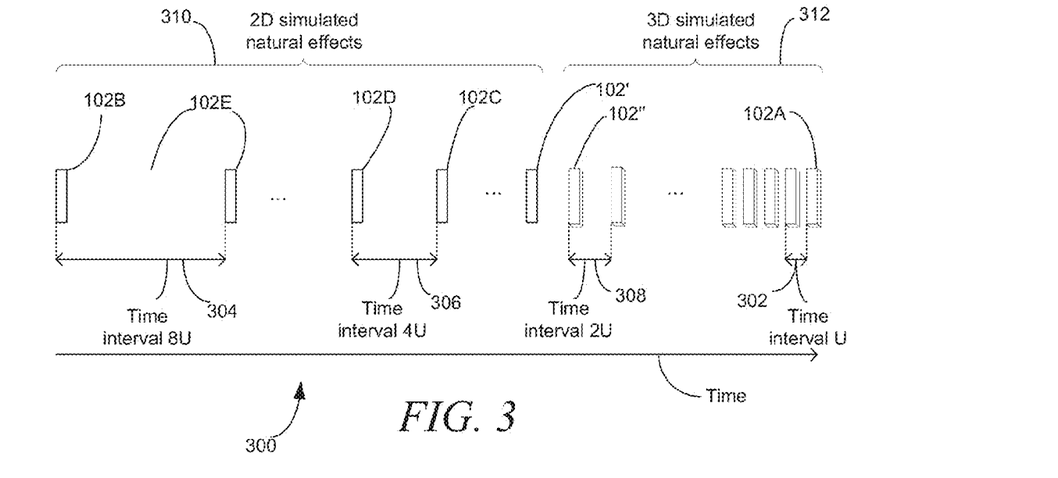
FIG. 3 is an illustration of a simulation sequence, in accordance with an example embodiment, configured to produce the natural effect based on simulating individual effects over time.

FIG. 3 is an illustration of a simulation sequence 300, in accordance with an example embodiment, configured to produce the natural effect 102 based on simulating individual natural effects 102 over time. The sequence 300 includes a sequence of the natural effects 102 as simulated mathematically but not necessarily rendered graphically. The sequence 300 includes a final simulated effect 102A as, for example, simulated by the simulator 206 that may be rendered by the rendering module 208 and caused to be displayed by the user interface module 210. The sequence 300 may be initiated by an initial effect 102B, such as predetermined or user-selected parameters for the physical model described above. Each effect 102C in the sequence 300 may be based on the physical model described herein as applied to an immediately preceding effect 102D of the sequence 300.

The final simulated effect 102A may be simulated at time interval 302 that correspond to one time unit U. Early simulated effects 102E may be simulated at time interval 304 that correspond to multiple time units U, such as eight time units U (or any other multiple of time units). Subsequent time intervals 306, 308 may correspond to progressively time units U of decreasing duration, such as four time units U and two time units U, respectively. Accordingly, in example embodiments, an effect may be simulated with decreasing time intervals. The decrease in time interval may be uniform (e.g., 8U, 4U, 2U, or U) or irregular (e.g., 8U, 4U, 4U, 1U).

Accordingly, in an example embodiment, adaptive time stepping may be used to incorporate a larger time interval at the beginning of the sequence 300 than at the end of the sequence 300, with the time intervals 302, 304 progressively refined as the final simulated effect 102A approaches in the sequence 300. Larger time intervals 304 at the beginning of the sequence 300 may provide for lower resolution during the early simulated effects 102E, which are not necessarily intended for use, in exchange for reduced use of computing resources in comparison to maintaining constant time intervals 302, 304 throughout the sequence 300. The lower resolution may be made up or substantially made up before the end of the sequence 300 by refining the smaller time intervals 302.

In an example, the time unit U is ¹⁄₁₂₀ of a second. In such an example, the time interval 8U may be applied to eighty (80) percent of the total time of the sequence 300, the time interval 4U may be applied to eighty (80) percent of the remainder (i.e., the following sixteen (16) percent), the time interval 2U may be applied to eighty (80) percent of the remainder (i.e., the following 3.2 percent), and the time interval U may be applied to the remainder (i.e., the remaining 0.8 percent). If the total simulated time for the sequence 300 is ten (10) seconds then one hundred twenty (120) effects 102 would be computed at 8U time intervals (8 seconds*fifteen effects/second), forty-eight (48) effects 102 would be computed at 4U time intervals (1.6 seconds*30 effects/second), twenty (20) effects 102 would be computed at 2U time intervals (0.32 seconds*60 effects/second=19.2 effects, occupying 20 intervals), and eight (8) effects 102 would occupy the remaining 0.08 seconds, for a total of one hundred ninety-six (196) total simulated effects 102. Such would be in contrast to 10*120=1,200 total simulated effects 102 without adaptive time stepping. It is noted that this foregoing is purely illustrative and that the principles described are readily applicable to times and time units of different desired lengths and ratios.

Various examples may utilize adaptive time stepping for one subset of simulated natural effects and not for another. As illustrated, the sequence 300 includes the initial first subset 310 simulated in two dimensions and the later second subset 312 simulated in three dimensions. As illustrated, both the first and second subsets 310, 312 utilize adaptive time stepping. However, in an example, the first subset 310 as rendered in two dimensions does not utilize adaptive time stepping while the second subset 312 does utilize adaptive time stepping. In an example, the first subset 310 utilizes adaptive time stepping while the second subset 312 does not utilize adaptive time stepping. In an example, neither the first nor second subsets 310, 312 utilize adaptive time stepping.

VELOCITY INITIALIZATION WITH NOISE

In various examples, the velocity u in any one or more of the two-dimensional and/or three-dimensional simulation Equations 1-5 may be supplemented or modified with random noise. Such random noise may be selectable, such as from a factor of ten (10) to fifty (50) times greater than conventional velocity u. The pressure variable P may operate to reduce or mitigate the impact of a relatively large velocity noise factor. Such noise may provide for increased fuel and temperature transfers within the simulation in a way that may compensate for adaptive time stepping early in the sequence 300. In various examples, the velocity noise factor is proportional to the time intervals 302, 304, with the late time intervals 302 having one (1) time unit U having little to no noise factor. In various examples, not every effect 102 corresponding to time intervals 304, 306, 308 incorporate a velocity noise factor. In various examples, only every other effect 102, every third effect 102, every fourth effect 102, or other ratio, incorporates the velocity noise factor. In an example, only an effect that transitions from two dimensions to three dimensions incorporates the velocity noise factor.

EXAMPLE TWO-DIMENSIONAL-GUIDED THREE-DIMENSIONAL SIMULATION

Further, as illustrated, the sequence 300 includes the initial first subset 310 simulated in two dimensions and the later second subset 312 simulated in three dimensions. In such examples, the sequence 300 may be of a predetermined simulated time duration or include a predetermined number of effects 102. The initial effect 102B may be in two dimensions and the final simulated effect 102A may be in three dimensions, with the sequence 300 switching from two dimensions to three dimensions at some time point during the sequence 300. It is to be noted and understood that in various examples, the sequence 300 optionally does not necessarily transition from two-dimensional simulation to three-dimensional simulation and instead outputs the natural effect 102 in two dimensions.

Two-dimensional natural effects 102 may be plotted on a two-dimensional grid about a plane $S_{2D}$. For certain variables described herein, such as may be applied to Equations 1-6 above, no conversion from the two-dimensional grid $S_{2D}$ to three-dimensional space may be needed or useful. However, certain variables including pressure and velocity may be converted to three-dimensional space to transition from two-dimensional space to three-dimensional space.

The physical model described herein may, in various examples, include incompressible pressure and velocity variables. In various examples, where $$\frac{\partial w}{\partial z} = -q \text{ on } S_{2D},$$

where w is the z component of velocity u=(u,v,w), pressure and velocity may not be incompressible as simulated, which may, in various examples, result in an undesirable appearance of the effect 102 as rendered. In an example, pressure projection is modified on $S_{2D}$ so that velocities (u,v) are not updated by the projection and $$\frac{\partial w}{\partial z} = 0.$$

Doing so yields the following equation on the $S_{2D}$ plane:

$$\frac{\partial w}{\partial z} = -q \quad \text{Equation 7}$$

Outside of the $S_{2D}$ plane may be defined by:

$$\nabla^2 P = \frac{\rho}{\Delta t}(\nabla \cdot u) \quad \text{Equation 8}$$

In such examples, velocity may be defined on the $S_{2D}$ plane by:

$$w^{n+1} = w + \frac{\Delta t}{\rho}\frac{\partial w}{\partial z} \quad \text{Equation 9}$$

While velocity may be defined outside of the $S_{2D}$ plane by:

$$u^{n+1} = u + \frac{\rho}{\Delta t}\nabla P \quad \text{Equation 10}$$

As such, individual two-dimensional natural effects 102' can be converted into three-dimensional natural effects 102" in such a way that corresponds to artificial divergence q in the two-dimensional simulations. In various examples, w may be any value in the $S_{2D}$ plane. In an example, the noise factor described herein is applied to the two-dimensional natural effect 102' to produce, at least in part, the three-dimensional effect 102".

In various examples, the sequence 300 includes a predetermined number of natural effects 102 and/or a predetermined number of time units U. The predetermined number of effects 102 or units U may be selectable by a user so that the final simulated effect 102A has a desired appearance. In the above example, if a user desires an image of a flame that occurs shortly after ignition of a fuel source and thus appears "young", the user may select a sequence with relatively few time units U, such as fifty time units. By contrast, if the user desires an image of a steady flame, the user may select one hundred fifty time units. In an example, a time unit U is 1/60 of a second. It is noted that time units U may be of various length depending on the nature of the natural effect 102. Thus, a relatively fast natural effect, such as a small-scale flame, may have short time units while a relatively slow natural effect, such as a large scale fire or large smoke effect, may have relatively long time units.

Figure 4:
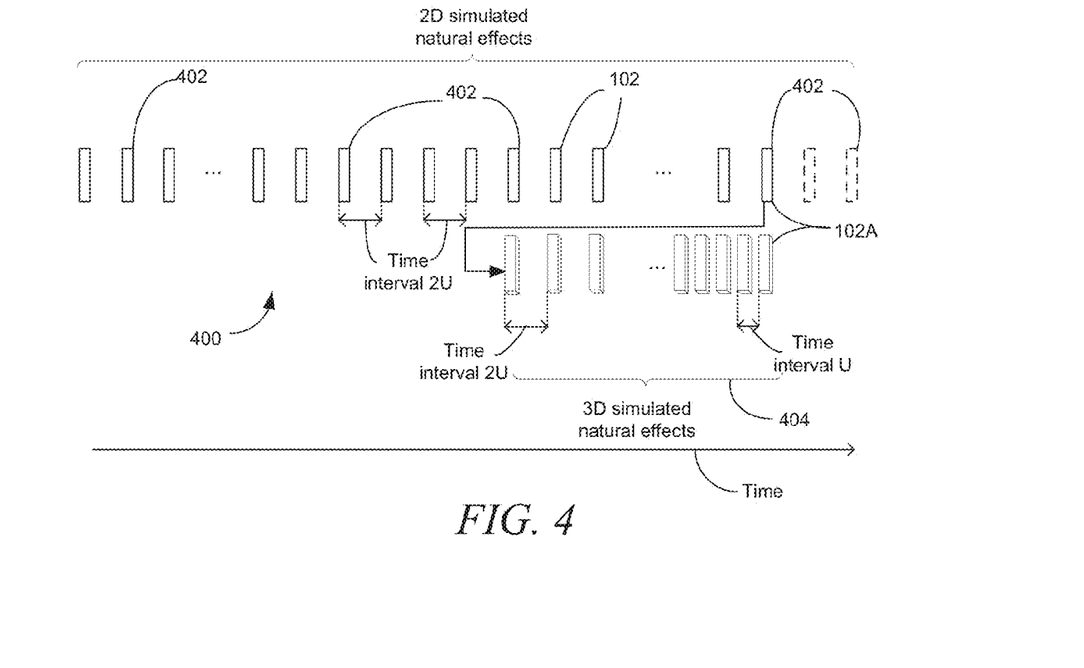
FIG. 4 is an illustration of a simulation sequence, in accordance with an example embodiment, configured to produce the natural effect based on a user input.

FIG. 4 is an illustration of a simulation sequence 400, in accordance with an example embodiment, configured to produce the final simulated effect 102A based on a user input. The sequence 400 may be initially simulated in two dimensions according to example methods described herein. Certain effects 402 may be rendered to provide a two-dimensional example of the effect 402 for display to a user. In an example, each effect 402 is simulated upon user rejection of a preceding effect 402. As such, effects 402 after the selected final effect 102A may optionally not be rendered.

In various examples, a user may interact with effects 402 with the user interface module 210 upon the effects 402 being displayed. User interaction may appropriately alter variables in the equations described herein for subsequent simulated effects 102 in comparison with the variables utilized in the equations for effects prior to the effect 402. For instance, a user may alter the kinetic viscosity, density, body force, time, or any of a variety of variables for simulating effects 102 after the effect 402 that is the subject of the user interaction. The user interaction may be explicit, numerical-interaction with the variables or may be graphic-based, with changes to the variables deriving from the graphic interaction with the effect 102.

Alternatively or additionally, each effect 402 is simulated prior to showing the effects 402 to the user, whereupon the user may select one of the effects 402 among all of the effects 402. Effects 402 may be predetermined or selected by a user (e.g., via a graphical user interface), such as by selecting an identifier corresponding to the effect 402. As many effects 402 may be rendered as may be useful to a user to select a particular one of the effects 402 to be the final simulated effect 102A.

Upon selection of a particular effect 402 as the final simulated effect 102A, the system 200 may then backtrack a predetermined number of effects 102 or time units U and begin simulating a subset 404 of the effects 102 of the sequence 400 in three dimensions according to the processes described herein. For instance, an effect 402 is rendered in two dimensions and presented to the user who selects the effect 402 as the desired final simulated effect 102A for rendering in three dimensions. The simulator 206 then steps back fifty (50) time units U in the sequence 400 and re-simulates the subsequent subset 404 of effects 102 in three dimensions. Upon returning to the selected effect 102A, the selected effect 102A is simulated and rendered in three dimensions and caused to be presented to the user.

The number of time units U or effects 102 that the system 200 backtracks may be selected based on an understanding of the processes used by the simulator 206. For instance, the simulator 206 may be set to backtrack a number of time units known or believed to be effective in creating a rich three-dimensional effect 102 based on a starting two-dimensional image. Stated differently, the simulator 206 may be configured to backtrack just enough to create a convincing three-dimensional rendering of the effect 102, thereby providing the effect and minimizing consumption of system 200 resources.

As illustrated, the two-dimensional effects 400 are simulated with constant time units while the three-dimensional effects 404 are simulated with adaptive time units, with the three-dimensional effects 404 initially simulated at the same 2U intervals as the two-dimensional effects 102 and then finally at 1U intervals. Alternatively, both the two-dimension effects 400 and the three-dimensional effects 404 may incorporate constant time units U or 2U or both may incorporate adaptive time units. The time units for the two-dimensional effects 400 may be the same or different as the three-dimensional effects 404. In various examples, the two-dimensional simulation of the sequence 400 may be done with first time units longer than second time units applied to the subset 404.

Figure 5:
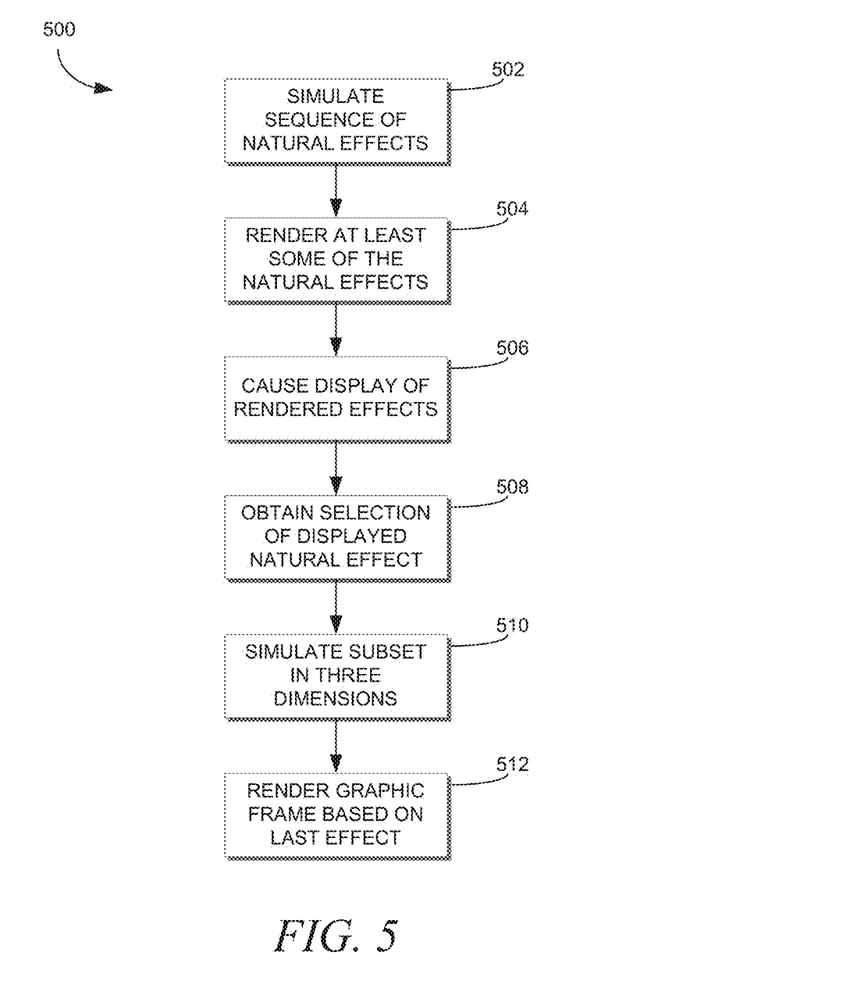
FIG. 5 is a flow chart illustrating a method, in accordance with an example embodiment, for time-based graphical simulation of a natural effect, in accordance with an example embodiment.

FIG. 5 is a flow chart 500 illustrating a method, in accordance with an example embodiment, for time-based graphical simulation of a natural effect. The method may be performed by processing logic that may comprise hardware (e.g., dedicated logic, programmable logic, microcode, etc.), software (such as run on a general purpose computer system programmed to perform particular functions pursuant to instructions from program software or on a dedicated machine), or a combination of both. The processing logic, according to example embodiments, may reside in any of the modules shown in FIG. 2. Alternative embodiments may comprise more, less, or functionally equivalent modules or engines in various combinations. While certain modules or engines are described as performing certain operations, these descriptions are merely examples and the operations may be performed by other components or systems.

At operation 502, a sequence 300, 400 of discrete natural effects 102 is simulated by the simulator 206, each natural effect 102 of the sequence 300, 400 being based on an initial effect 102B, an immediately preceding effect 102, and a simulated time interval 302, 304, 306, 308 since the immediately preceding effect 102. In an example, the initial effect 102B is a two-dimensional simulated natural effect and wherein a last one of the second consecutive simulated effect 102A is a three-dimensional simulated natural effect. In an example, a first subset 310 of the sequence 300 of natural effects is simulated in two-dimensions and wherein a second subset 312 of the sequence 300 of natural effects later than the first subset 310 is simulated by the simulator 206 in three-dimensions.

In an example, a first simulated time interval 304 between first consecutive natural effects 102 is greater than a second simulated time interval 302 between second consecutive natural effects 102 later in the sequence 300, 400 than the first consecutive natural effects 102. In an example, the natural effect 102 is simulated based on a physical model of the natural effect 102 and a noise factor, the noise factor being based on the simulated time interval 302, 304, 306, 308 since the immediately preceding natural effect 102. In an example, the noise factor for simulating a final simulated effect 102A of the sequence 300, 400 is zero. In an example, the physical model includes at least one of a velocity, a fuel density, a smoke density, and a temperature. In an example, the natural effect 102 is a flame effect. In an example, the physical model includes at least some of an initial energy corresponding to the initial natural effect, a pressure, a kinetic viscosity, a density, a body force, a heat capacity constant, a fuel burn rate, and a heating value of a fuel.

At operation 504, at least some of the sequence 400 of natural effects 402 are optionally rendered by the rendering module 208.

At operation 506, at least some of the natural effects 402 as rendered by the rendering module 208 at operation 504 are optionally caused to be displayed by the user interface module 210.

At operation 508, a user selection is optionally obtained by the user interface module 210 of a natural effect 402 as rendered by the rendering module 208 and as displayed by the user interface module 210.

At operation 510, the simulator 206 optionally simulates in three dimensions a subset 404 of the sequence 400 of natural effects 102, the subset 404 including the selected natural effect 402 from operation 508 and a predetermined number of the sequence 400 of natural effects 102 immediately preceding the selected natural effect 402. In an example, the selected natural effect 402 becomes the final simulated effect 102A.

At operation 512, the rendering module 208 renders a graphic frame based on a final simulated effect 102A of the sequence 300, 400.

Figure 6:
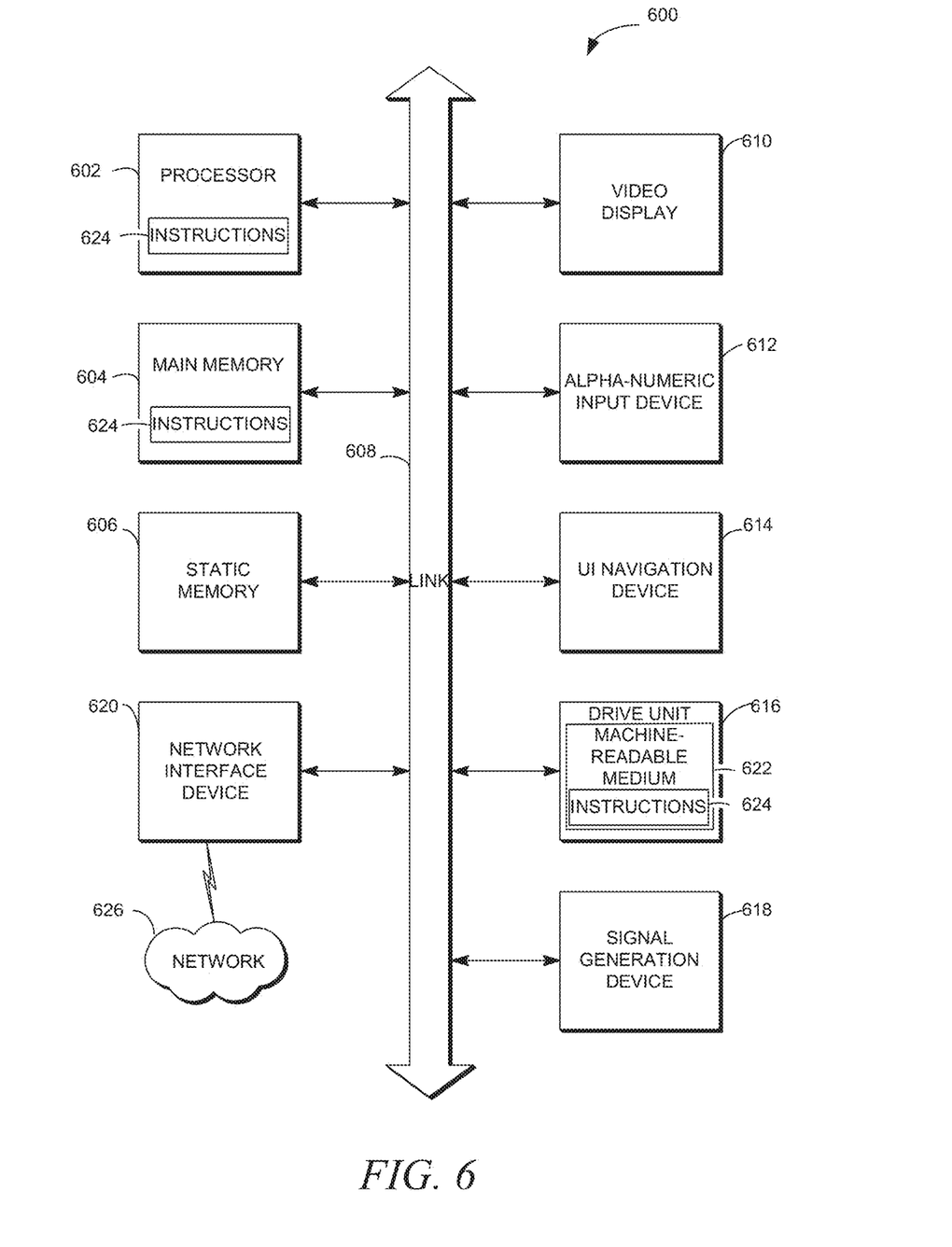
FIG. 6 is a block diagram illustrating components of a machine, according to some example embodiments, able to read instructions from a machine-readable medium and implement one or more of the example methodologies described herein.

FIG. 6 is a block diagram illustrating components of a machine 600, according to some example embodiments, able to read instructions from a machine-readable medium (e.g., a machine-readable storage medium) and perform any one or more of the methodologies discussed herein. Specifically, FIG. 6 shows a diagrammatic representation of the machine 600 in the example form of a computer system and within which instructions 624 (e.g., software) for causing the machine 600 to perform any one or more of the methodologies discussed herein may be executed. In alternative embodiments, the machine 600 operates as a standalone device or may be connected (e.g., networked) to other machines. In a networked deployment, the machine 600 may operate in the capacity of a server machine or a client machine in a server-client network environment, or as a peer machine in a peer-to-peer (or distributed) network environment. The machine 600 may be a server computer, a client computer, a personal computer (PC), a tablet computer, a laptop computer, a netbook, a set-top box (STB), a personal digital assistant (PDA), a cellular telephone, a smartphone, a web appliance, a network router, a network switch, a network bridge, or any machine capable of executing the instructions 624, sequentially or otherwise, that specify actions to be taken by that machine. Further, while only a single machine is illustrated, the term "machine" shall also be taken to include a collection of machines that individually or jointly execute the instructions 624 to perform any one or more of the methodologies discussed herein.

The machine 600 includes a processor 602 (e.g., a central processing unit (CPU), a graphics processing unit (GPU), a digital signal processor (DSP), an application specific integrated circuit (ASIC), a radio-frequency integrated circuit (RFIC), or any suitable combination thereof), a main memory 604, and a static memory 606, which are configured to communicate with each other via a bus 608. The machine 600 may further include a graphics display 610 (e.g., a plasma display panel (PDP), a light emitting diode (LED) display, a liquid crystal display (LCD), a projector, or a cathode ray tube (CRT)). The machine 600 may also include an alphanumeric input device 612 (e.g., a keyboard), a cursor control device 614 (e.g., a mouse, a touchpad, a trackball, a joystick, a motion sensor, or other pointing instrument), a storage unit 616, a signal generation device 618 (e.g., a speaker), and a network interface device 620.

The storage unit 616 includes a machine-readable medium 622 on which is stored the instructions 624 (e.g., software) embodying any one or more of the methodologies or functions described herein. The instructions 624 may also reside, completely or at least partially, within the main memory 604, within the processor 602 (e.g., within the processor's cache memory), or both, during execution thereof by the machine 600. Accordingly, the main memory 604 and the processor 602 may be considered as machine-readable media. The instructions 624 may be transmitted or received over a network 626 via the network interface device 620.

As used herein, the term "memory" refers to a machine-readable medium able to store data temporarily or permanently and may be taken to include, but not be limited to, random-access memory (RAM), read-only memory (ROM), buffer memory, flash memory, and cache memory. While the machine-readable medium 622 is shown in an example embodiment to be a single medium, the term "machine-readable medium" should be taken to include a single medium or multiple media (e.g., a centralized or distributed database, or associated caches and servers) able to store instructions. The term "machine-readable medium" shall also be taken to include any medium, or combination of multiple media, that is capable of storing instructions (e.g., software) for execution by a machine (e.g., machine 600), such that the instructions, when executed by one or more processors of the machine (e.g., processor 602), cause the machine to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory, an optical medium, a magnetic medium, or any suitable combination thereof.

Thus, method and system for a time-based simulation of a graphical natural effect have been described. While some example approaches described herein may be used with ADOBE® products, the techniques described herein may be utilized beneficially with various other products.

The embodiments described herein may be implemented in an operating environment comprising software installed on a computer, in hardware, or in a combination of software and hardware. Although embodiments have been described with reference to specific example embodiments, it will be evident that various modifications and changes may be made to these embodiments without departing from the broader spirit and scope of the inventive subject matter. Accordingly, the specification and drawings are to be regarded in an illustrative rather than a restrictive sense.

The invention claimed is:

1. A computerized method comprising:
using a processor, simulating a sequence of discrete natural effects, each natural effect of the sequence being based on an initial natural effect, an immediately preceding natural effect, and a time interval since the immediately preceding natural effect, the sequence being based on a physical model of the discrete natural effects and a noise factor, the noise factor being applied to a transition from a natural effect simulated in two dimensions and a natural effect simulated in three dimensions;
rendering at least some of the sequence of discrete natural effects; and
causing display of the discrete natural effects as rendered.

2. The method of claim 1, wherein natural effects of a first subset of the sequence of natural effects is simulated in two-dimensions and wherein natural effects of a second subset of the sequence of natural effects later than the first subset is simulated in three-dimensions.

3. The method of claim 1, wherein the sequence of natural effects is simulated in two dimensions, and further comprising:
obtaining a user selection of a selected natural effect of the natural effects as rendered;
simulating in three dimensions a subset of the sequence of natural effects, the subset including the selected natural effect and a predetermined number of the sequence of natural effects immediately preceding the selected natural effect; and
rendering the selected natural effect in three dimensions.

4. The method of claim 1, wherein a first time interval between first consecutive natural effects is greater than a second time interval between second consecutive natural effects later in the sequence than the first consecutive natural effects.

5. The method of claim 1, wherein the physical model includes at least one of a velocity, a fuel density, a smoke density, and a temperature.

6. The method of claim 1, wherein the natural effect is a flame effect.

7. The method of claim 6, wherein the physical model includes at least some of an initial energy corresponding to the initial natural effect, a pressure, a kinetic viscosity, a density, a body force, a heat capacity constant, a fuel burn rate, and a heating value of a fuel.

8. The method of claim 1, further comprising rendering a graphic frame based on a last simulated natural effect of the sequence.

9. A computer-implemented system comprising:
a natural effect simulator configured to simulate a sequence of discrete natural effects based on a physical model of the natural effects and a noise factor, each natural effect of the sequence being based on an initial natural effect, an immediately preceding natural effect, and a time interval since the immediately preceding natural effect,
the initial natural effect being a two-dimensional simulated natural effect and a last one of a second consecutive simulated natural effect being a three-dimensional simulated natural effect, the noise factor being applied to a transition from a natural effect simulated in two dimensions and a natural effect simulated in three dimensions; and
a rendering module configured to render at least some of the sequence of natural effects.

10. The system of claim 9, wherein the simulator is configured to:
simulate natural effects of a first subset of the sequence of natural effects in two-dimensions; and
simulate natural effects of a second subset of the sequence of natural effects later than the first subset in three-dimensions.

11. The system of claim 9, wherein the simulator is configured to simulate the sequence of natural effects in two dimensions, and further comprising:
a user interface module configured to:
cause a display of the natural effects as rendered; and
obtain a user selection of a selected natural effect of the natural effects as rendered;
wherein the simulator is configured to simulate in three dimensions a subset of the sequence of natural effects, the subset including the selected natural effect and a predetermined number of the sequence of natural effects immediately preceding the selected natural effect; and
wherein the rendering module is configured to render the selected natural effect in three dimensions.

12. The system of claim 9, wherein a first time interval between first consecutive natural effects is greater than a second time interval between second consecutive natural effects later in the sequence than the first consecutive natural effects.

13. The system of claim 9, wherein the physical model includes at least one of a velocity, a fuel density, a smoke density, and a temperature.

14. The system of claim 9, wherein the natural effect is a flame effect.

15. The system of claim 14, wherein the physical model includes at least some of an initial energy corresponding to the initial natural effect, a pressure, a kinetic viscosity, a density, a body force, a heat capacity constant, a fuel burn rate, and a heating value of a fuel.

16. A non-transitory machine-readable medium having instruction data to cause a machine to:
simulate a sequence of discrete natural effects based on a physical model of the natural effects and a noise factor, each natural effect of the sequence being based on an initial natural effect, an immediately preceding natural effect, and a time interval since the immediately preceding natural effect, a first time interval between first consecutive natural effects being greater than a second time interval between second consecutive natural effects later in the sequence than the first consecutive natural effects, the initial natural effect being a two-dimensional simulated natural effect and a last one of the second consecutive natural effects being a three-dimensional simulated natural effect, the noise factor being applied to a transition from a natural effect simulated in two dimensions and a natural effect simulated in three dimensions;

render at least some of the sequence of natural effects; and cause display of the natural effects as rendered.

\* \* \* \* \*